United States Patent
Schubert et al.

(10) Patent No.: US 9,768,271 B2
(45) Date of Patent: Sep. 19, 2017

(54) METHODS, DEVICES, AND SYSTEMS RELATED TO FORMING SEMICONDUCTOR POWER DEVICES WITH A HANDLE SUBSTRATE

(71) Applicant: Micron Technology, Inc., Boise, ID (US)

(72) Inventors: Martin F. Schubert, Boise, ID (US); Vladimir Odnoblyudov, Eagle, ID (US); Cem Basceri, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/774,313

(22) Filed: Feb. 22, 2013

(65) Prior Publication Data

US 2014/0239348 A1    Aug. 28, 2014

(51) Int. Cl.
*H01L 21/683* (2006.01)
*H01L 29/66* (2006.01)
(Continued)

(52) U.S. Cl.
CPC .... *H01L 29/66462* (2013.01); *H01L 21/6835* (2013.01); *H01L 21/6836* (2013.01);
(Continued)

(58) Field of Classification Search
CPC .. H01L 29/66431; H01L 29/778; H01L 21/50
(Continued)

(56) References Cited

U.S. PATENT DOCUMENTS 7,666,788 B2 *  2/2010  Sinha ............................ 438/667
7,687,876 B2    3/2010  Kabir
(Continued)

FOREIGN PATENT DOCUMENTS

WO          0180286 A2    10/2001
WO       2008147102 A2    12/2008

OTHER PUBLICATIONS

International Search Report and Written Opinion mailed Jun. 19, 2014 in International Patent Application No. PCT/US2014/017982, 14 pages.

*Primary Examiner* — Robert Huber
*Assistant Examiner* — J. R. Oakley
(74) *Attorney, Agent, or Firm* — Perkins Coie LLP

(57) ABSTRACT

Methods of manufacturing device assemblies, as well as associated semiconductor assemblies, devices, systems are disclosed herein. In one embodiment, a method of forming a semiconductor device assembly includes forming a semiconductor device assembly that includes a handle substrate, a semiconductor structure having a first side and a second side opposite the first side, and an intermediary material between the semiconductor structure and the handle substrate. The method also includes removing material from the semiconductor structure to form an opening extending from the first side of the semiconductor structure to at least the intermediary material at the second side of the semiconductor structure. The method further includes removing at least a portion of the intermediary material through the opening in the semiconductor structure to undercut the second side of the semiconductor structure.

17 Claims, 6 Drawing Sheets

(51) Int. Cl.
*H01L 29/778* (2006.01)
*H01L 29/06* (2006.01)
*H01L 27/06* (2006.01)
*H01L 29/20* (2006.01)

(52) U.S. Cl.
CPC ...... *H01L 27/0605* (2013.01); *H01L 29/0657* (2013.01); *H01L 29/7787* (2013.01); *H01L 29/2003* (2013.01); *H01L 2221/6834* (2013.01); *H01L 2221/68327* (2013.01); *H01L 2221/68368* (2013.01); *H01L 2221/68381* (2013.01)

(58) Field of Classification Search
USPC .................. 438/458, 739, 751, 167, 172
See application file for complete search history.

(56) References Cited

U.S. PATENT DOCUMENTS

| | | | |
|---|---|---|---|
| 7,968,379 | B2 | 6/2011 | Chu et al. |
| 2001/0031514 | A1 | 10/2001 | Smith |
| 2002/0117728 | A1 | 8/2002 | Brosnihhan et al. |
| 2003/0235974 | A1 | 12/2003 | Martinez et al. |
| 2006/0073621 | A1* | 4/2006 | Kneissel et al. ............... 438/21 |
| 2008/0237605 | A1* | 10/2008 | Murata et al. ................. 257/76 |
| 2009/0057719 | A1* | 3/2009 | Takahashi et al. ........... 257/194 |
| 2009/0155972 | A1 | 6/2009 | Watanabe |
| 2010/0066348 | A1* | 3/2010 | Merz et al. ................. 324/71.1 |
| 2010/0110157 | A1* | 5/2010 | Yonehara et al. ............ 347/130 |
| 2010/0317132 | A1* | 12/2010 | Rogers et al. ................. 438/27 |
| 2012/0211727 | A1 | 8/2012 | Ohlsson et al. |
| 2012/0244683 | A1 | 9/2012 | Akagi |
| 2013/0032784 | A1* | 2/2013 | Chaji et al. ..................... 257/27 |

\* cited by examiner

US 9,768,271 B2

METHODS, DEVICES, AND SYSTEMS RELATED TO FORMING SEMICONDUCTOR POWER DEVICES WITH A HANDLE SUBSTRATE

TECHNICAL FIELD

The present technology is related to semiconductor devices that are fabricated with a support substrate. In particular, some embodiments of the present technology are related to power transistor devices and methods for manufacturing such devices.

BACKGROUND

High electron mobility transistors (HEMTs) employ a heterojunction defined by semiconductor materials having different bandgap energy levels. A gate provides an applied electric field to the heterojunction, which causes a conductive channel to be formed between the source and drain of the HEMT. Another electrical field applied across the source and drain causes an electrical current to flow through the conductive channel. When the applied field of the gate is removed, the electrical current between the source and drain will cease flowing, even when the applied field between the source and drain is not removed. High voltage HEMTs are used in a variety of devices and applications, including power supplies, electric cars, solar cells, and large solid state transistors, to name a few.

The breakdown voltage of a high voltage device is proportional to the amount of parasitic electrical current that leaks away from the current flowing between the source and the drain. When a voltage larger than the breakdown voltage is applied, parasitic current will flow regardless of whether there is an applied field provided by the gate (i.e., when the device is in an off state). This parasitic current limits device performance, including the maximum operational voltage.

DETAILED DESCRIPTION

Figure 1A:
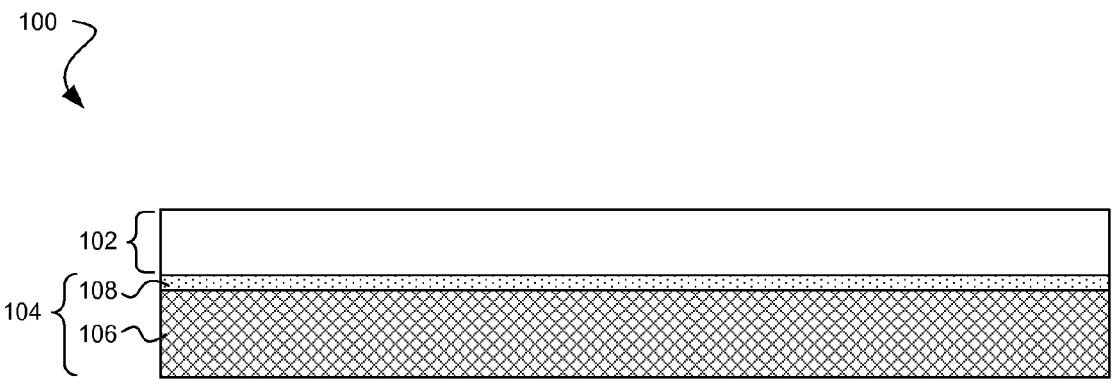
FIGS. 1A-E are cross-sectional views illustrating a method of forming a semiconductor device assembly in accordance with selected embodiments of the present technology.

Specific details of several embodiments of methods for making semiconductor devices are described herein along with related devices and systems. The term "semiconductor device" generally refers to a solid-state device that includes semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer-level or at the die-level. Furthermore, unless the context indicates otherwise, structures disclosed herein can be formed using conventional semiconductor-manufacturing techniques. Materials can be deposited, for example, using chemical vapor deposition, physical vapor deposition, atomic material deposition, spin coating, and/or other suitable techniques. Similarly, materials can be removed, for example, using plasma etching, wet etching, chemical-mechanical planarization, or other suitable techniques. Further, features can be formed in structures, for example, by forming a patterned mask (e.g., a photoresist mask or a hard mask) on one or more semiconductor materials and depositing materials or removing materials in combination with the patterned mask Many embodiments of the present technology are applicable to power transistors having high operating voltages (e.g., high electron mobility transistors (HEMTs)). A person having ordinary skill in the relevant art will recognize, however, that the present technology may apply to other types of semiconductor devices, including bipolar transistors or solid state transducer devices that emit light (e.g., light emitting diodes (LEDs), laser diodes, etc.). Also, while described herein in the context of compound semiconductor devices (e.g., III-nitride-based semiconductor devices), embodiments of the present technology are not so limited and can include other types of materials. For example, semiconductor devices can be manufactured in Silicon (Si). Further, the present technology may be practiced without several of the details of the embodiments described herein with reference to FIGS. 1A-8.

For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in a cross section that can be compositionally similar, but the use of the same shading does not imply that the materials should be construed to be identical.

As discussed above in the background section, parasitic conduction can limit semiconductor device performance. Parasitic current can flow between active regions of the device as well as through the bulk material of the semiconductor device (e.g., the substrate region adjacent to or below the active regions). In a conventional compound semiconductor device, the bulk substrate usually includes a portion of the substrate used to form the device. This substrate, commonly referred to as a "handle" substrate, can provide a support surface for epitaxial growth. The handle substrate is typically not removed because removal requires additional processing steps that complicate manufacturing and increase manufacturing costs. Rather, the handle substrate is singulated along with the other semiconductor materials to form the semiconductor device.

Methods and devices in accordance with embodiments of the present technology, however, can provide several advantages over these and other manufacturing techniques. A method can include, for example, removing an intermediary material (e.g., a sacrificial material) located between a semiconductor structure and a handle substrate to provide mechanical and electrical isolation from the handle substrate. In some embodiments, most (or all) of the intermediary material is removed to decouple the semiconductor structure from the handle substrate. In other embodiments, only a portion of the intermediary material is removed to form a gap between the semiconductor structure and the handle substrate. In these embodiments, the semiconductor structure and the handle substrate remain coupled together through intermediary material.

In general, the intermediary material is removed via openings formed in the semiconductor structure (e.g., by removing the intermediary material away from the structure through the openings and/or dissolving the intermediary material adjacent the openings). These openings, for example, can be trenches that also serve to separate the semiconductor structure into individual semiconductor devices. In additional or alternative embodiments, the openings can extend through an active region of the device to provide access to the intermediary material through the opening in the active region. In further embodiments, other openings can extend partially through the semiconductor structure to mechanically isolate active regions of the structure from one another.

FIGS. 1A-1E are cross-sectional side views of a semiconductor device assembly 100 in various stages of manufacture in accordance with selected embodiments of the present technology. FIG. 1A shows the semiconductor device assembly 100 after a semiconductor structure 102 has been formed on a support structure 104. The semiconductor structure 102 can have a plurality of dies or other structures that include integrated circuitry or other types of semiconductor devices. As such, the semiconductor structure 102 can include a single semiconductor material, a stack of different semiconductor materials, as well as other suitable materials. Although omitted for purposes of clarity, a person having ordinary skill in the art will appreciate that the semiconductor structure 102 can include a variety of materials. For example, in addition to materials that are semiconductive, the semiconductor structure 102 can include conductive materials (e.g., metallic materials) and insulative materials (e.g., dielectric materials). Also, the semiconductor structure 102 can include a variety of features formed throughout the structure. For example, the semiconductor structure 102 can include a through-substrate interconnect (not shown) that extends through the semiconductor structure 102. Such a through-substrate interconnect can electrically connect opposite sides of a finished semiconductor device, for example.

The support structure 104 includes a handle substrate 106 and an intermediary material 108 between the handle substrate 106 and the semiconductor structure 102. The handle substrate 106 can mechanically support the semiconductor structure 102 during manufacturing. The handle substrate 106 can also facilitate formation of one or more materials, features, or other aspects of the semiconductor structure 102. For example, the handle substrate 106 can facilitate the growth of epitaxial semiconductor materials on the handle substrate 106. In some embodiments, the handle substrate 106 can include ceramic, glass, poly-Aluminum Nitride (p-AlN), or other suitable materials. P-AlN-based handle substrates, for example, can have a coefficient of thermal expansion (CTE) that is similar to the CTE of Gallium Nitride (GaN)-based materials.

The intermediary material 108 is between the semiconductor structure 102 and the handle substrate 106. As discussed above, the intermediary material 108 is a sacrificial material that can be removed (or at least partially removed) from between the semiconductor structure 102 and the handle substrate 106. For example, the intermediary material 108 can include a deposited oxide material and/or a native oxide. In some embodiments, oxide materials can be fused together to attach the semiconductor structure 102 with the handle substrate 106. For example, the native oxide of the semiconductor structure 102 can be fused with an oxide material of the handle substrate 106. The intermediary material 108 can also include a different material in addition to or in lieu of an oxide material. For example, the intermediary material 108 can include a nitride-based material.

Figure 1B:
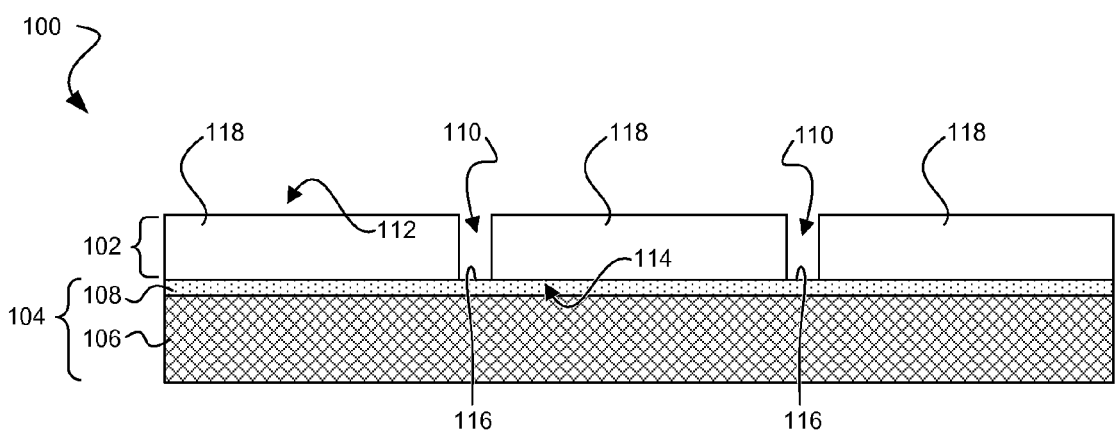

FIG. 1B shows the semiconductor device assembly 100 after removing material from the semiconductor structure 102 to form openings 110 in the semiconductor structure 102. In particular, the openings 110 can extend from a first side 112 of the semiconductor structure 102 to a second side 114 of the semiconductor structure 102 to expose surfaces 116 of the intermediary material 108 through the openings 110. The exposed surfaces 116, for example, can be flush with the semiconductor structure 102 at the second side 114 of the structure. In other embodiments, the exposed surfaces 116 can be recessed in the intermediary material 108, or the openings 110 can extend completely through the intermediary material 108 (not shown) such that the exposed surfaces 116 are just the remaining sidewalls of the intermediary material 108. For example, the openings 110 can be configured to expose a portion of the handle substrate 106 through the openings 110. In several embodiments, the openings 110 can at least partially define individual mesas 118 in the semiconductor structure 102. For example, in one embodiment described in further detail below with reference to FIG. 2, the openings 110 can include trenches that isolate the individual mesas 118 from one another. Each mesa 118 can define a die having one or more integrated circuits or other features.

Figure 1C:
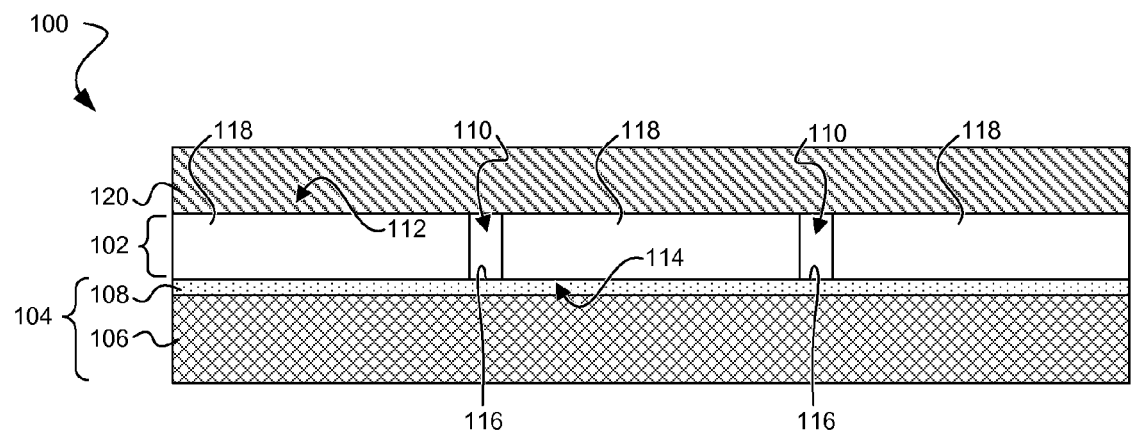

FIG. 1C shows the semiconductor device assembly 100 after a transfer structure 120 is attached to the semiconductor structure 102. The transfer structure 120 can include an adhesive (not shown) for at least temporarily binding the individual mesas 118 with the transfer structure 120. The transfer structure 120 is configured to support the individual mesas 118 of the semiconductor structure 102 after the handle substrate 106 has been removed. The transfer structure 120 can include a die-attach tape, a carrier substrate (e.g., a wafer), or other suitable structure that is configured to support the individual mesas 118 in subsequent processing stages. In some embodiments, the transfer structure 120 can be used to shield the active surfaces of the semiconductor structure 102 from contamination and debris associated with operator handling. The transfer structure 120 can also provide a diffusion barrier that mitigates oxidation at the active surfaces of the individual mesas 118. In other embodiments, however, the transfer structure 120 can be omitted, and thus the manufacturing stage at FIG. 1C can likewise be omitted. For example, the transfer structure 120 can be omitted in embodiments in which the semiconductor structure 102 is not decoupled from the support structure 104 (see, e.g., FIGS. 6 and 7).

Figure 1D:
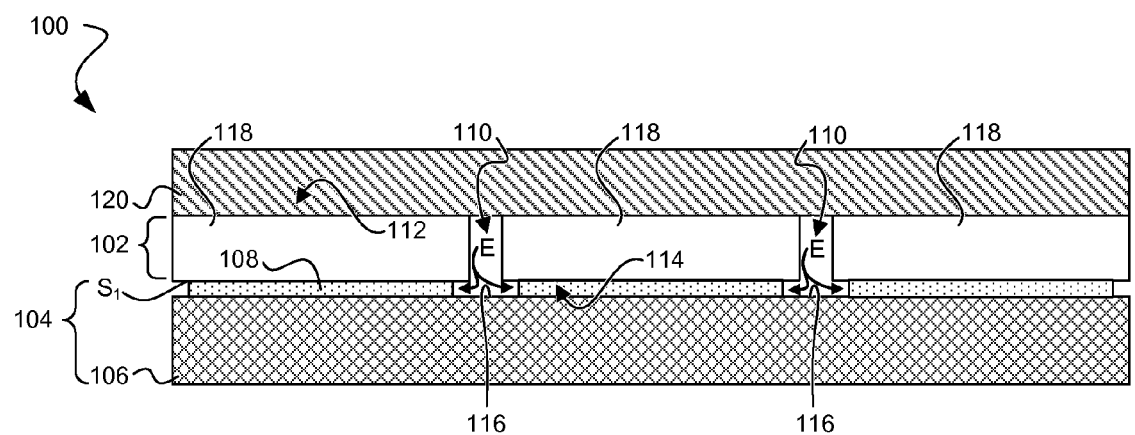

FIG. 1D shows the semiconductor device assembly 100 after a portion of the intermediary material 108 adjacent the openings 110 has been removed via the openings 110 of the semiconductor structure 102. In particular, the removed intermediary material forms a gap $S_1$ that undercuts the individual mesas 118 of the semiconductor structure 102 at the second side 114. In some embodiments, the semiconductor device assembly 100 can be placed into a chemical etchant (e.g., a chemical bath) to submerge or at least partially submerge the semiconductor structure 102 in the etchant. As shown by arrows "E", the etchant undercuts the portions of the semiconductor structure 102 adjacent the openings 110 in the semiconductor structure 102. The transfer structure 120 can be configured such that it does not substantially degrade in an acidic (or basic) solution of the chemical etchant.

Figure 1E:
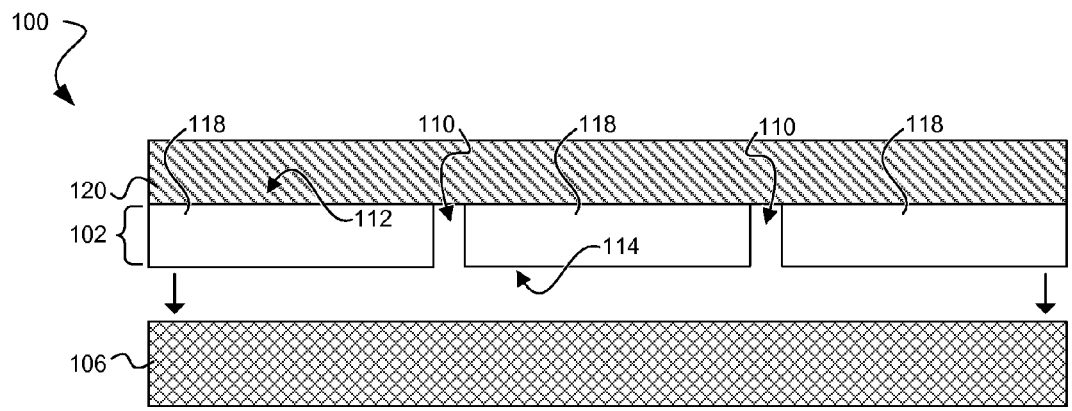

FIG. 1E shows the semiconductor device assembly 100 after the semiconductor structure 102 has been decoupled from the handle substrate 106. In particular, the semiconductor structure 102 is decoupled by removing the intermediary material 108 (FIG. 1D) until the handle substrate 106 is released from the semiconductor structure 102. Once released, the handle substrate 106 can be recycled and used to form other semiconductor structures. Alternatively, the handle substrate 106 can be discarded depending on the life-cycle of the handle substrate 106. For example, the handle substrate 106 can be discarded if it has become too thin, contaminated, and/or cycled more than a pre-determined number of times.

Figure 2:
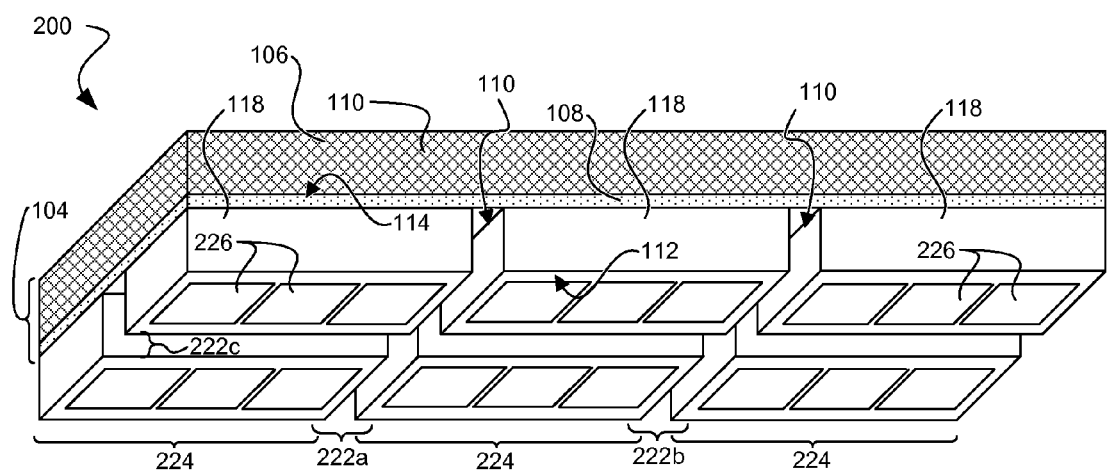
FIG. 2 is an isometric view of a semiconductor device assembly in accordance with a selected embodiment of the present technology.

FIG. 2 is an isometric view of a semiconductor device assembly 200 configured in accordance with a selected embodiment of the present disclosure. The semiconductor device assembly 200 can be similar to the semiconductor device assembly 100 after the processing stage of FIG. 1B, but in FIG. 2 the semiconductor device assembly 200 is inverted. In the embodiment shown in FIG. 2, the openings 110 between the individual mesas 118 are trenches 222 (identified individually as first through third trenches 222a-222c) that extend to the intermediary material 108 of the support structure 104. In the illustrated embodiment, the first and second trenches 222a and 222b are generally in parallel with one another and are generally perpendicular with the third trench 222c. In this configuration, the trenches 222 separate the semiconductor structure 102 to form discrete semiconductor devices 224. Although the Figures show the trenches 222 in a linear arrangement, in other embodiments one or more of the trenches 222 can have a non-linear arrangement (e.g., curved, sloped, etc.)

The semiconductor devices 224 can include electrical contacts 226 (e.g., metal contact pads). In one embodiment, the semiconductor structure 102 (FIG. 1A) can be formed to include the electrical contacts 226. Alternatively, the electrical contacts 226 can be formed on the semiconductor structure 102 at a later processing stage. The electrical contacts 226 can include a variety of suitable conductive materials that are electrically coupled to one or more active regions of the semiconductor devices 224. In the illustrated embodiment, the semiconductor devices 224 are "direct-attach" devices in which the electrical contacts can be directly bonded (e.g., via eutectic bonding) to a printed circuit board (not shown) or other suitable substrates. In several embodiments, direct-attach configurations can simplify assembly of semiconductor devices on such a substrate.

Figure 3:
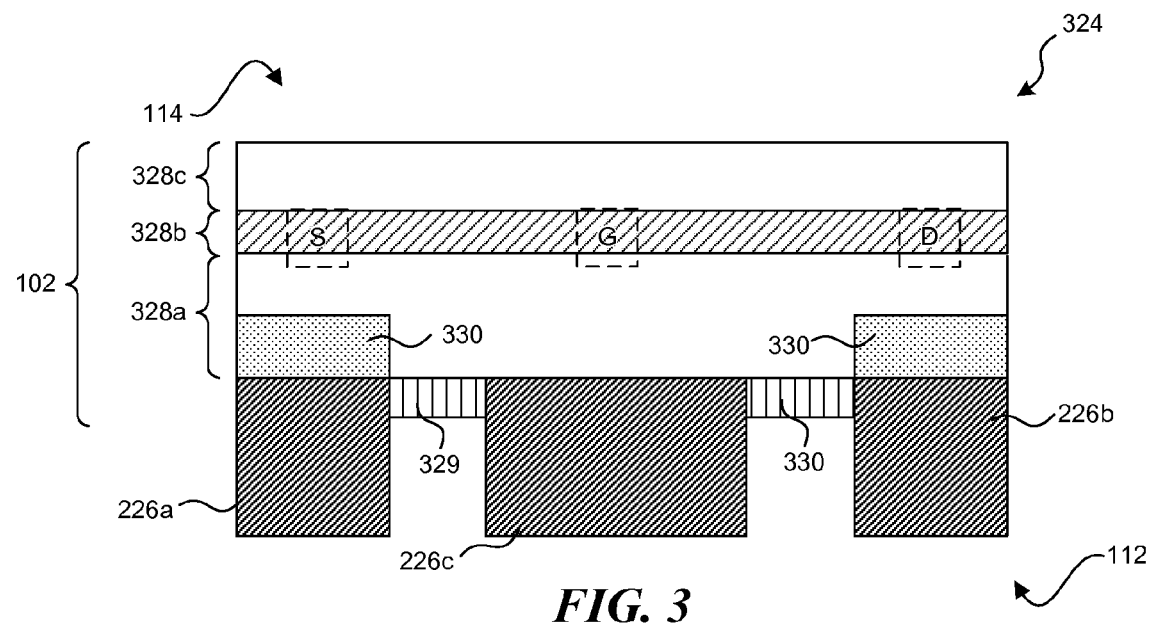
FIGS. 3-6 are cross-sectional views illustrating semiconductor devices in accordance with selected embodiments of the present technology.

FIG. 3 is a schematic cross-sectional side view of a semiconductor device 324 configured in accordance with an embodiment of the present technology. The semiconductor device 324, for example, can be similar to one of the semiconductor devices 224 of FIG. 2 after the support structure 104 has been removed. The semiconductor structure 102 of the semiconductor device 324 includes a stack of semiconductor materials 328 (identified individually as first through third semiconductor materials 328a-c). For clarity, active regions of the semiconductor structure 102 are identified as source "S," gate "G," and drain "D" regions of a transistor device (e.g., of a HEMT power transistor device).

However, embodiments of the semiconductor device 324 can include other types of active regions. For example, in other embodiments, active regions can include regions other than source, gate, and/or drain regions. Further, the active regions can be located in another type device, such as a bipolar transistor device, a capacitor, etc.

The semiconductor device 324 further includes electrical contacts 226 (identified individually as first through third electrical contacts 226a-226c) and a dielectric material 329 (e.g., Silicon Nitride (SiN)) that separates the individual electrical contacts 226 from one another. The first and second electrical contacts 226a and 226b are coupled, respectively, to the source S and drain D regions of the semiconductor structure 102 through Ohmic contact regions 330 (e.g., locally doped regions of the first semiconductor material 328a). The third electrical contact 226c is coupled to the gate region G of the semiconductor device 324 without an intermediary Ohmic contact region. In one embodiment, the first semiconductor material 328a of the semiconductor device 324 includes Aluminum GaN (AlGaN) and the second semiconductor material 328b includes GaN. In several embodiments, the third semiconductor material 328c can include AlGaN. In other non-illustrated embodiments the semiconductor device 324 can include different materials and/or features.

In operation, the gate region G provides a conductive channel (e.g., a two-dimensional electron gas channel) that extends between the source region S and the drain region D of the semiconductor device 324. As discussed above, the semiconductor device 324 can have less parasitic conduction (or no parasitic conduction) relative to conventional semiconductor devices. In particular, the handle substrate 106 (FIG. 1E) has been decoupled to remove parasitic conduction paths.

Figure 4:
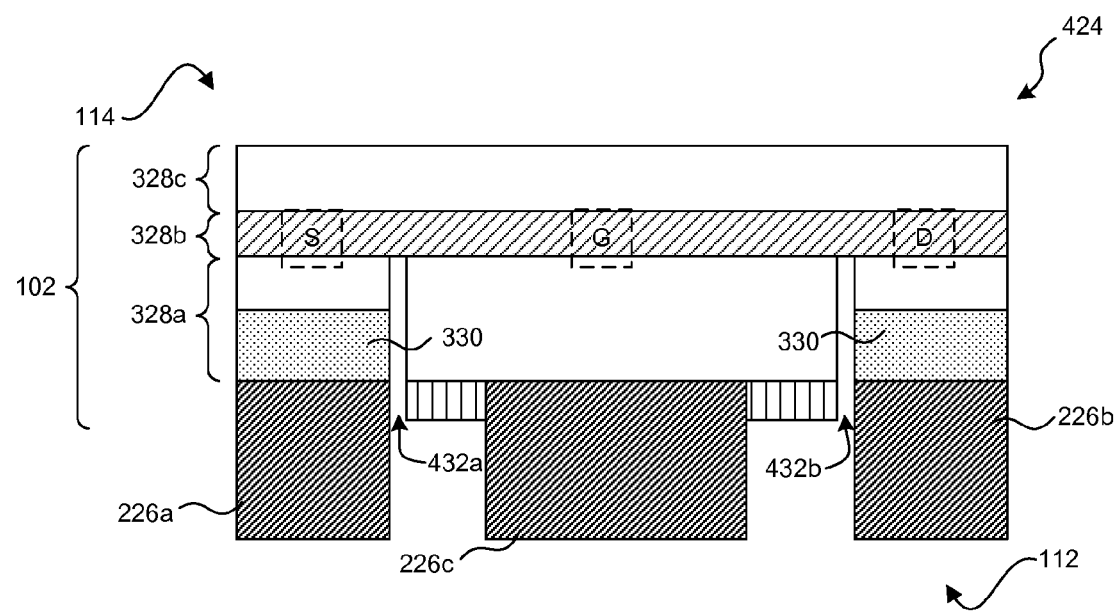

FIG. 4 is a schematic cross-sectional side view of a semiconductor device 424 configured in accordance with another embodiment of the present technology. The semiconductor device 424, for example, can be similar to the semiconductor device 324 of FIG. 3. However, the semiconductor device 424 is different than the semiconductor device 324 of FIG. 3 in that the semiconductor device 424 includes first and second trenches 432a and 432b formed in the semiconductor structure 102. In particular, the first and second trenches 432a and 432b mechanically isolate the source and drain regions S and D from the gate region G. Such mechanical isolation can, for example, decrease parasitic conduction between the source region S and the gate region G and/or the drain region D and the gate region G.

In one embodiment, the first and second trenches 432a and 432b can be formed in the semiconductor structure 102 by one or more etch processes. For example, the second semiconductor material 328b can be configured as an etch stop material. Alternatively, the etch processes can be timed to form the first and second trenches 432a and 432b to a depth that does not substantially extend (or extend at all) into the second semiconductor material 328b. In one embodiment, the first and second trenches 432a and 432b are formed in the semiconductor structure 102 at stage before the stage of FIG. 1A. In other embodiments, the first and second trenches are formed at a different manufacturing stage. For example, the first and second trenches 432a and 432b can be formed in semiconductor device assembly that incorporates a portion of the handle substrate into the finished device.

Figure 5:
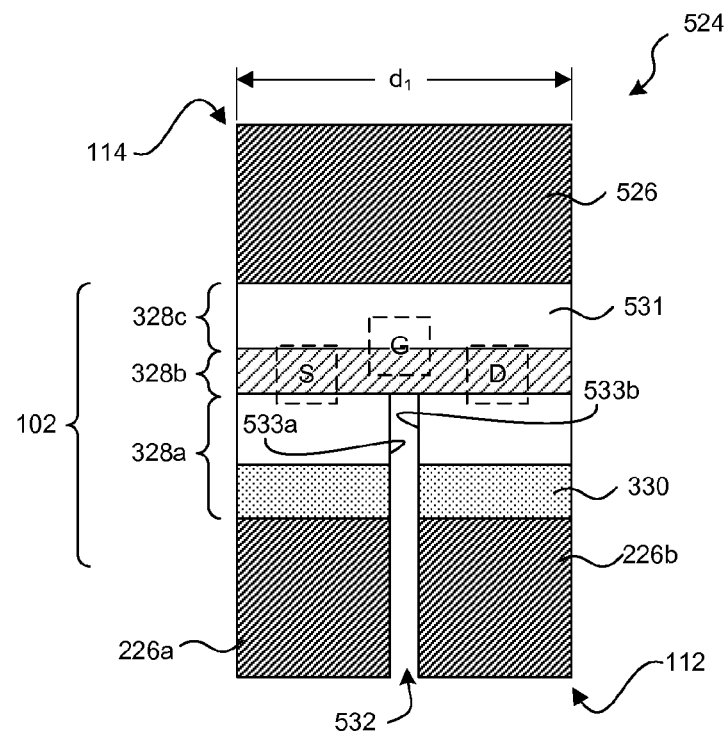

FIG. 5 is a schematic cross-sectional side view of a semiconductor device 524 configured in accordance with a further embodiment of the present technology. The semiconductor device 524, for example, can be similar to the semiconductor device 424 of FIG. 4. However, the semiconductor device 524 includes an electrical contact 526 at the second side 114 of the semiconductor device 424 (rather than between the source and drain regions S and D at a first side 112 of the semiconductor device). The electrical contact 526 can be formed, for example, by depositing a conductive material on the third semiconductor material 328c at the second side 114 of the semiconductor device 524. In this example, the third semiconductor material 328c can be the gate region G. In some embodiments, a dimension $d_1$ (e.g., a length or a surface area) can be configured to achieve a certain capacitance at the gate region G. Such a configuration has several advantages over conventional devices in that the dimension $d_1$ does not change the overall footprint of the semiconductor device 524 (so long as the dimension $d_1$ of the gate region G is smaller than the combined dimensions of the first and second electrical contacts 226a and 226b). By contrast, a gate region in a conventional transistor device is typically constrained to a particular range of dimensions. In particular, because the source, gate, and drain regions of a conventional device are all located at the same side of the device, each region contributes to the overall footprint. For example, to retain a certain footprint size, the gate region can only be increased in size if one or both of the source and drain regions S and D are decreased in size.

The semiconductor device 524 is also different than the semiconductor device 424 of FIG. 4 in that the semiconductor device 524 includes a trench 532 between the source region S and the drain region D (rather than between the gate region G and each of the source region S and the drain region D). The trench 532 includes a first sidewall 533a adjacent the source region S and a second sidewall 533b adjacent the drain region D. In some embodiments, however, the trench 532 can be omitted and the source region S can be isolated from the drain region D differently. For example, the source region S and the drain region D can include semiconductor material with different doping types (e.g., P-type or N-type) to form a reverse-biased diode between these regions.

Figure 6:
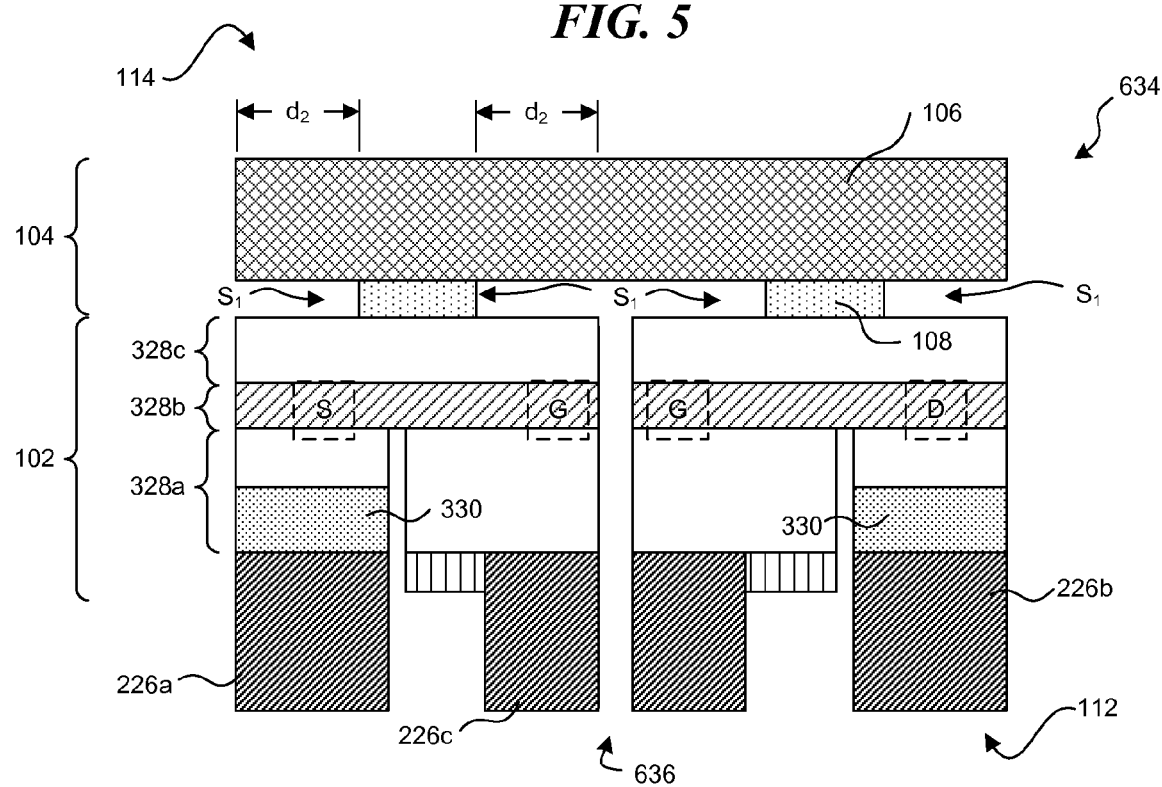

FIG. 6 is a schematic cross-sectional side view of a semiconductor device 634 configured in accordance with yet another embodiment of the present technology. The semiconductor device 634 is different than the semiconductor devices 224 of FIG. 2 in that the semiconductor device 634 remains coupled to the handle substrate 106 via the intermediary material 108. As illustrated, the semiconductor device 634 includes an opening 636 formed through the gate region G of the semiconductor device 634. In this configuration, the opening 636 provides a passageway through which an etchant can remove a portion of the intermediary material 108 to undercut the gate region G. The amount of undercut can be configured to mechanically isolate the gate region G from the handle substrate 106 by an undercut distance $d_2$ of the gap $S_1$. The undercut distance $d_2$ can be selected to achieve a certain amount of isolation. For example, the undercut distance $d_2$ can extend beyond the gate region G and beneath the source and drain regions S and D (not shown). In another embodiment, a different active region of the semiconductor device 634 can be mechanically isolated. For example, the source region S and/or the drain region D can be mechanically isolated from the handle substrate 106 through an opening formed through source region S and/or the drain region D.

In some embodiments, the amount of undercut can be configured to provide mechanical isolation, but also retain a sufficient amount of the intermediary material 108 at the second side of 114 of the semiconductor device 634 such that the semiconductor device 634 does not readily decouple from the handle substrate 106. For example, the source region S and/or the drain region D can be undercut by the gap $S_1$ (e.g., adjacent the opening 110; FIG. 1D), with the undercut distance $d_2$ selected such that the third semiconductor material 328c does not readily decouple from the handle substrate 106. In another, non-illustrated embodiment, one or both of the source and drain regions S and D have no undercut at all or are only an undercut at one side (e.g., at the side adjacent the gate region G).

Figure 7:
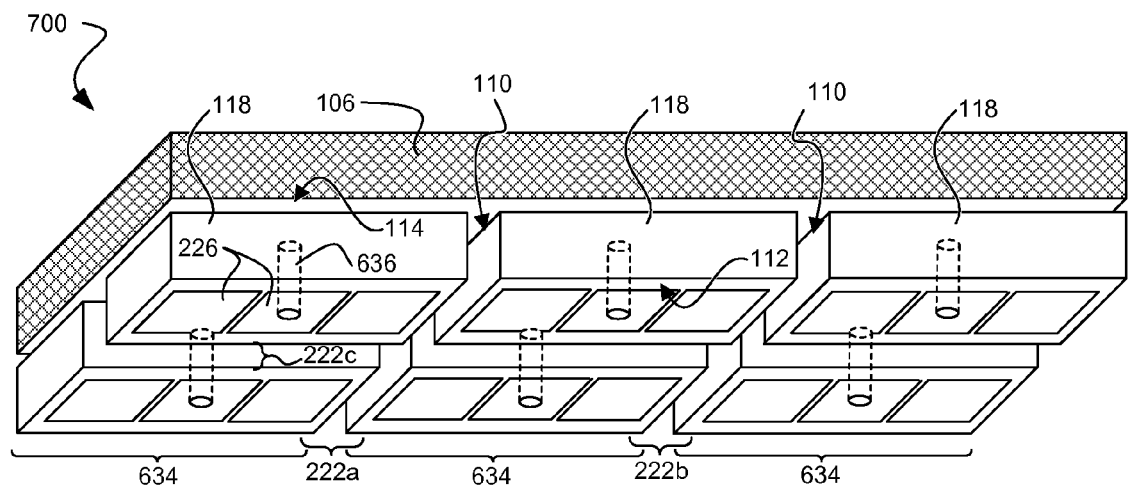
FIG. 7 is an isometric view of a semiconductor device assembly in accordance with a selected embodiment of the present technology.

FIG. 7 is an isometric view of a semiconductor device assembly 700 configured in accordance with a selected embodiment of the present disclosure. The semiconductor device assembly 700 can be similar to the semiconductor device assembly 100 after the processing stage of FIG. 1C (shown without the transfer structure 120 on the first side 112 of the semiconductor structure 102 in FIG. 7). However, the semiconductor device assembly 700 is different than the semiconductor device assembly 100 in that individual semiconductor devices 634 include the opening 636 through the semiconductor device 634. As shown, the openings 636 can be cylindrical; however, in other embodiments the openings 636 can have different shapes. For example, the openings 636 can be elongated trenches that are parallel with the first and second trenches 222a and 222b.

Also, the semiconductor device assembly 700 can be similar to the semiconductor device assembly 200 of FIG. 2. However, the semiconductor device assembly 700 is different than the semiconductor device assembly 200 in that the semiconductor devices 634 are configured to be singulated such that they include a portion of the handle substrate 106. In one embodiment, for example, the trenches 222 can provide locations for dicing streets, which can be subsequently cut to singulate the individual semiconductor devices 634 (e.g., via a dicing saw). In another embodiment, however, the trenches 222 can be omitted and the semiconductor devices 634 can be separated by conventional singulation techniques known in the art.

A person having ordinary skill in the art will recognize that semiconductor devices can be manufactured using other types of semiconductor device assemblies or other suitable structures without deviating from the scope of the various embodiments of the present technology. In general, a method of forming a semiconductor device can include forming a stack of semiconductor materials on a support structure (e.g., the support structure 104); forming openings in a stack of semiconductor materials (e.g., the semiconductor structure 102), where portions of the support structure are exposed through the openings; and undercutting at least a portion of the stack of semiconductor materials adjacent the openings in the stack semiconductor materials. In another example, a method of forming a semiconductor device can include forming a semiconductor structure that includes a first semiconductor material (e.g., the first semiconductor material 328a), a second semiconductor material (e.g., the second semiconductor material 328b), a first active region formed in the first semiconductor material (e.g., the source region S), a second active region formed in the first semiconductor material (e.g., the drain region D or the gate region G), and a trench between the first active region and the second active region.

Figure 8:
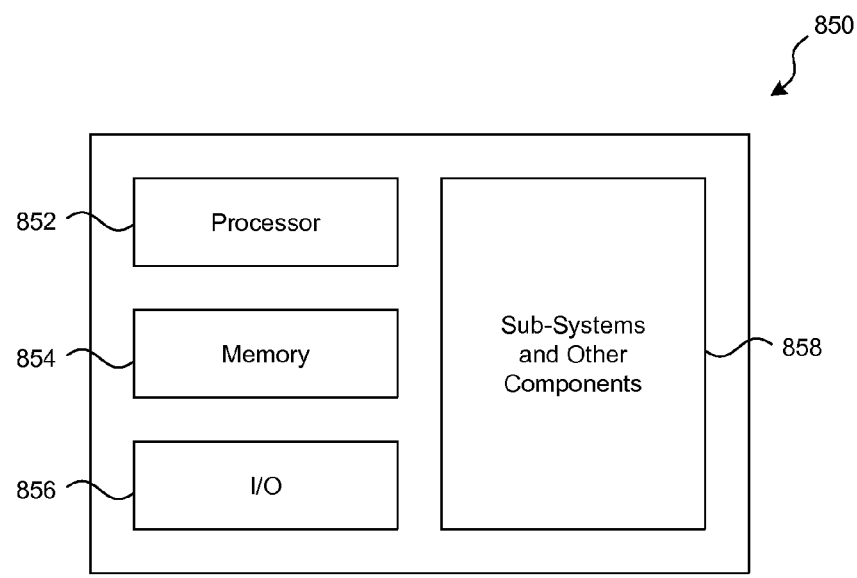
FIG. 8 is a block diagram illustrating a system that incorporates a semiconductor device in accordance with selected embodiments of the present technology.

Any one of the semiconductor devices and semiconductor device assemblies having the features described above with reference to FIGS. 1A-7 can be incorporated into any of a myriad of larger and/or more complex systems, a representative example of which is system 850 shown schematically in FIG. 8. The system 850 can include a processor 852, a memory 854 (e.g., SRAM, DRAM, flash, and/or other memory devices), input/output devices 856, and/or other subsystems or components 858. The semiconductor devices and semiconductor device assemblies described above with reference to FIGS. 1A-7 can be included in any of the elements shown in FIG. 8. The resulting system 850 can be configured to perform any of a wide variety of suitable computing, processing, storage, sensing, imaging, and/or other functions. Accordingly, representative examples of the system 850 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 850 include lights, cameras, vehicles, etc. With regard to these and other examples, the system 850 can be housed in a single unit or distributed over multiple interconnected units, e.g., through a communication network. The components of the system 850 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. For example, the semiconductor device assemblies 100, 200, and 700 shown, respectively, in FIGS. 1, 2, and 7 can include a variety of other features. For example, these assemblies and others can be configured to form multiple semiconductor devices rather than a single semiconductor device. In addition, the semiconductor device assemblies can include a network of conductive structures (e.g., traces) for intercoupling semiconductor devices. As another example, the semiconductor devices 224, 324, 424, 524, and 634 shown, respectively, in FIGS. 2-7 can similarly include a variety of other features. For example the gate region G can include multiple semiconductor materials between the first semiconductor material 328a and the third electrical contact 226c to achieve a particular operating parameter (e.g., a capacitance). Certain aspects of the new technology described in the context of particular embodiments may also be combined or eliminated in other embodiments. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method, comprising:
    forming a semiconductor device assembly that includes:
        a handle substrate;
        a semiconductor structure having a first side, a second side opposite the first side, and a gate region, wherein the gate region is between the source and drain regions of a transistor device; and
        an intermediary material between the semiconductor structure and the handle substrate;
    removing material from the semiconductor structure to form an opening extending from the first side of the semiconductor structure to at least the intermediary material at the second side of the semiconductor structure, wherein the opening extends through the gate region; and
    decoupling the semiconductor structure from the handle substrate, wherein decoupling the semiconductor structure includes:
        attaching a transfer structure to the semiconductor structure at the first side and such that a portion of the transfer structure extends across, and thereby completely covers, the opening; and
        removing at least a portion of the intermediary material via the opening in the gate region of the semiconductor structure to undercut the second side of the semiconductor structure, wherein removing the intermediary material includes exposing the intermediary material to an etchant via the opening and by flowing the etchant between the portion of the transfer structure and a portion of the handle substrate facing the portion of the transfer structure across the opening.

2. The method of claim 1 wherein:
    the portion of the intermediary material is a first portion of the intermediary material;
    the method further comprises forming a first trench proximate the source region, and a second trench proximate the drain region, wherein the first and second trenches extend from the first side of the semiconductor structure to at least the intermediary material at the second side of the semiconductor structure, and wherein the first and second trenches at least partially define a mesa in the semiconductor structure;
    removing a second portion of the intermediary material via the first trench; and
    removing a third portion of the intermediary via the second trench.

3. The method of claim 2 wherein:
    the handle substrate comprises a poly-Aluminum Nitride substrate (p-AlN); and
    the method comprises forming a power transistor that includes the mesa formed in the semiconductor structure.

4. The method of claim 2, further comprising removing material from the semiconductor structure to mechanically isolate active regions in the semiconductor structure.

5. The method of claim 2 wherein the opening in the gate region includes an elongated trench, and wherein the elongated trench and the first and second trenches are parallel to one another.

6. The method of claim 1 wherein exposing the intermediary material to the etchant further comprises etching the intermediary material to form a gap between the semiconductor structure and the handle substrate.

7. A method of forming a semiconductor device assembly, comprising:
    forming a stack of semiconductor materials on a handle substrate, the stack of semiconductor materials including a gate region of a transistor device;
    forming openings in the stack of semiconductor materials, wherein portions of the handle substrate are exposed through the openings, and wherein the openings include a first opening extending through the gate region, a second opening adjacent a source region of the transistor device, and a third opening adjacent a drain region of the transistor device;
    attaching a transfer structure to the stack of semiconductor materials, wherein portions of the transfer structure extend across and completely cover corresponding ones of the openings to define passageways between the portions of the handle substrate and the corresponding portions of the transfer structure; and undercutting the stack of semiconductor materials adjacent the openings in the stack of semiconductor materials, wherein undercutting the stack of semiconductor materials includes flowing etchant into the passageways.

8. The method of claim 7 wherein undercutting the stack of semiconductor materials further comprises at least partially submerging the stack of semiconductor materials in an etchant.

9. The method of claim 7, further comprising forming a semiconductor device, wherein the semiconductor device includes at least a portion of the stack of semiconductor materials.

10. The method of claim 9 wherein the transistor device is a power transistor.

11. The method of claim 9 wherein the transistor device is a high electron mobility transistor (HEMT) device.

12. The method of claim 9 wherein the semiconductor device is a direct-attach device.

13. The method of claim 7 wherein undercutting the portion of the stack of semiconductor materials comprises decoupling the stack of semiconductor materials from the handle substrate.

14. The method of claim 13, further comprising
forming a semiconductor device to include at least a portion of the stack of semiconductor materials;
forming a first electrical contact at a first side of the semiconductor device; and
forming a second electrical contact at a second side of the semiconductor device that is opposite the first side of the semiconductor device.

15. The method of claim 7, further comprising forming a semiconductor device to include at least a portion of the stack of semiconductor materials and a portion of the handle substrate.

16. The method of claim 7 wherein flowing the etchant includes submersing the handle substrate, the transfer structure, and the stack of semiconductor materials in the etchant.

17. The method of claim 7 wherein flowing the etchant includes decoupling the handle substrate from the stack of semiconductor materials with the transfer structure attached to the stack of semiconductor materials.

* * * * *